United States Patent [19]
Yasuda

[11] Patent Number: 5,847,934
[45] Date of Patent: Dec. 8, 1998

[54] HYBRID INTEGRATED CIRCUIT

[75] Inventor: Yukio Yasuda, Tokyo, Japan

[73] Assignee: Mitsubishi Denki Kabushiki Kaisha, Tokyo, Japan

[21] Appl. No.: 741,221

[22] Filed: Oct. 29, 1996

[30] Foreign Application Priority Data

May 20, 1996 [JP] Japan .................................. 8-124760

[51] Int. Cl.$^6$ ...................................................... H05K 5/00
[52] U.S. Cl. .......................... 361/753; 361/748; 361/801; 174/52.1
[58] Field of Search ..................................... 361/726, 727, 361/732, 740, 752, 753, 759, 763, 799, 801, 802, 816, 818, 751, 748; 174/51, 52.1

[56] References Cited

U.S. PATENT DOCUMENTS

| | | | |
|---|---|---|---|
| 5,267,125 | 11/1993 | Liu | 361/816 |
| 5,452,184 | 9/1995 | Scholder et al. | 361/799 |
| 5,537,294 | 7/1996 | Siwinski | 361/753 |
| 5,668,701 | 9/1997 | Fukai | 361/799 |
| 5,691,504 | 11/1997 | Sands et al. | 361/801 X |

FOREIGN PATENT DOCUMENTS

| | | |
|---|---|---|
| 426562 | 3/1992 | Japan . |
| WO 87/05776 | 9/1987 | WIPO . |

*Primary Examiner*—Leo P. Picard
*Assistant Examiner*—Jayprakash N. Gandhi

[57] ABSTRACT

A hybrid integrated circuit comprises a circuit substrate including an insulation substrate with various devices mounted thereon and with a patterned wiring having at least one selected electrode formed along one side of the insulation substrate and a metal conductor member including a plate portion with a pair of L-shaped clips, formed along one side thereof corresponding to the one side of the circuit substrate, for holding the circuit substrate inserted into the clips which are formed at places corresponding to the selected electrode of the circuit substrate so that the clips and the selected electrode make electrical contact when the circuit substrate is inserted into the clips.

14 Claims, 5 Drawing Sheets

HYBRID INTEGRATED CIRCUIT

BACKGROUND OF THE INVENTION

1. Field of the Invention

The present invention relates to the structure of a hybrid integrated circuit for reducing the impedance of its wiring, particularly the ground wiring, in order to remove radio wave frequency noises effectively.

2. Description of the Prior Art

In some cases an electronic device comprising electronic circuits does not operate as it should when it is exposed to a strong external radio wave. This is caused by the fact that part of the electronic device acts as an antenna and that the current induced by the radio waves affects the functions of the electronic circuits. The electronic device has wiring for power supply and signals. The wiring acts as an antenna for a strong radio wave and introduces noises to the electronic device. Since a typical radio wave is composed of high frequency components (megahertz), a capacitor is connected between the ground and the external signal terminal of the electronic device so that high frequency noise is shunted to the ground and is not allowed to enter the electronic circuits.

However, when the frequency of the noise is very high, capacitors structurally included in the electronic circuits exhibit inductance characteristics deviating from the ideal characteristics of the capacitors. In order to reduce such radio wave frequency noises, various devices have been developed and are commercially available. An example is a three-terminal capacitor, which has a grounding terminal with an extremely small inductance. FIG. 9 is a schematic diagram of a circuit in which three-terminal capacitors are used. In the figure three-terminal capacitors 80 are connected to the input and output terminals of a signal processing circuit 81 and shunt the high frequency noise introduced at those terminals to the ground.

These three-terminal capacitors do not work effectively if the ground wiring of the circuit has a high impedance. For that reason, electronic devices using glass epoxy substrates may have a multilayer structure for wiring, one for grounding and the others for ordinary circuits, or they may have their ground wiring as thick as possible in order to make the noise suppressing components as effective as possible.

Hybrid integrated circuits using ceramic substrates, however, must undergo a sintering process at a high temperature, which makes it difficult and expensive to employ the multilayer structure for them. Further, the wiring on the ceramic substrate has a higher impedance than a multilayer resin substrate because silver-palladium, used as a conductor for the ceramic substrate, has a higher resistance than copper used for the multilayer resin substrate.

SUMMARY OF THE INVENTION

An object of the present invention, therefore, is to solve the aforementioned problem, that is, to provide a hybrid integrated circuit, including a ceramic substrate, which has low impedance wiring so that noise suppressing components work effectively.

The present invention provides a hybrid integrated circuit comprising (a) a circuit substrate including an insulation substrate with various devices mounted thereon and with a patterned wiring having plural electrodes, such as grounding electrodes, formed along one side of the insulation substrate and (b) a metal conductor member, including a plate portion with L-shaped clip means formed along a side thereof corresponding to the one side of the circuit substrate, for holding the circuit substrate inserted into the clip means. The clip means is formed at least one place corresponding to at least one electrode of the circuit substrate so that the clip means and the at least one electrode make electrical contact when the circuit substrate is inserted into the clip means. The clip means may be comprised of a pair of clips formed apart. Further, each of the clips has a lead terminal at the end thereof.

The present invention also provides a hybrid integrated circuit comprising (a) a circuit substrate including an insulation substrate with various devices mounted thereon and with a patterned wiring having electrodes all formed in a single line along one side of the insulation substrate, the electrodes being connected to respective lead terminals and (b) a metal conductor member, including a plate portion with plural L-shaped clip means formed along a side thereof corresponding to the one side of the insulation substrate, for holding the circuit substrate inserted into the clip means. The clip means are formed at places corresponding to the electrodes, such as grounding electrodes, selected from the electrodes formed along one side of the insulation substrate so that the clip means and the selected electrodes make electrical contact when the circuit substrate is inserted into the clip means. The aforementioned hybrid integrated circuit may have the clip means of the metal conductor member formed at places corresponding to all the electrodes of the circuit substrate with each of the clip means having a lead terminal at the end thereof. In this case the clip means that do not correspond to the selected electrodes are cut off at the root portions on the plate portion after the clip means and the corresponding electrodes make electrical contact.

The plate portion of the metal conductor member and the insulation substrate of the circuit substrate are joined with an adhesive. The plate portion of the metal conductor member may have at least one through hole or notch therein. Further, the plate portion of the metal conductor member may have guides which allow the clip means to readily match the corresponding electrodes when the circuit substrate is inserted into the clip means. The aforementioned metal conductor member is formed in one piece.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

The embodiments of the present invention will be described in detail with reference to the accompanying drawings.

Embodiment 1

Figure 1:
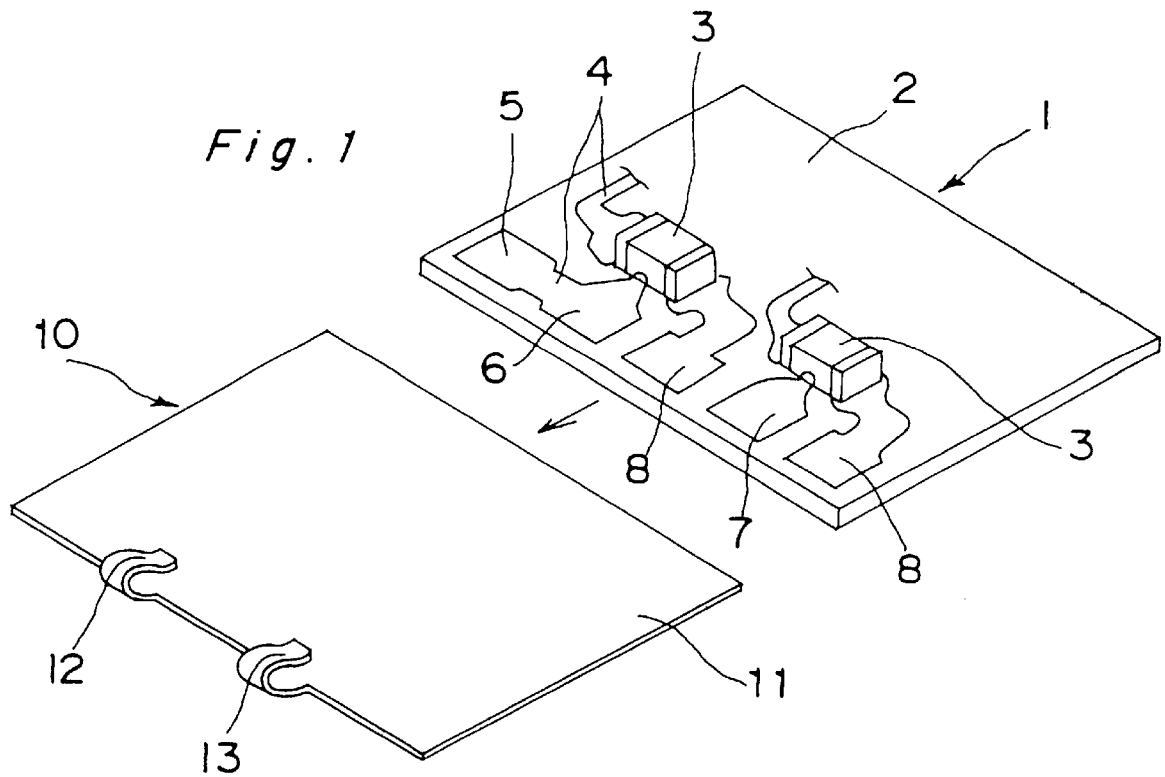
FIG. 1 is a perspective view of a circuit substrate and a metal conductor member constituting a hybrid integrated circuit.

FIG. 1 is a perspective view of a circuit substrate and a metal conductor member constituting a hybrid integrated circuit.

Referring to FIG. 1, a circuit substrate 1 comprises an almost rectangular insulation substrate 2, such as a ceramic substrate, which has silver-palladium wirings 4 patterned on it and all electrodes, for connecting to lead terminals, formed in a line along its side. The circuit substrate 1 has noise suppressing components 3, such as three-terminal capacitors, and other various devices (not shown) mounted on it.

Electrodes for connecting to lead terminals which, in turn, are connected to the ground are referred to as electrodes 5; electrodes for connecting to the metal conductor member are called electrodes 6 and 7; and other electrodes are referred to as electrodes 8. The electrodes 5 and 6 are placed next to each other and connected with the wiring pattern 4. Although the present embodiment uses two electrodes 6 and 7 for connecting to the metal conductor member, only one or more of such electrodes will work as well.

A metal conductor member 10 is an almost square metal plate 11 which includes almost "L" shaped clip means 12 and 13, formed on a side thereof, for holding the circuit substrate 1. The clip means 12 and 13 are formed at places corresponding to the electrodes 6 and 7 respectively. The metal conductor member 10 is formed in one piece: a metal plate is stamped in the desired shape which then undergoes a bending process to form the plate portion 11 and the clip means 12 and 13.

Figure 2:
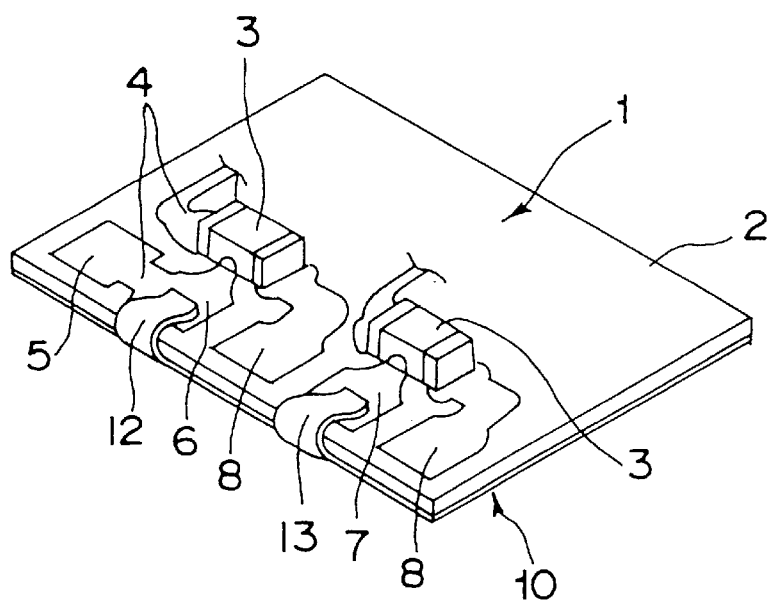
FIG. 2 is a perspective view illustrating the circuit substrate 1 of FIG. 1 and the metal conductor member 10 of FIG. 1 held together with the clip means.

FIG. 2 is a perspective view illustrating the circuit substrate 1 and the metal conductor member 10 held together by the clip means. In FIG. 2 the clip means 12 of the metal conductor member 10 connects to the electrode 6 and the clip means 13 connects to the electrode 7. The plate portion 11 of the metal conductor member 10 is joined to the non-mounting surface of the insulation substrate 2 with an insulate adhesive (not shown).

Figure 3:
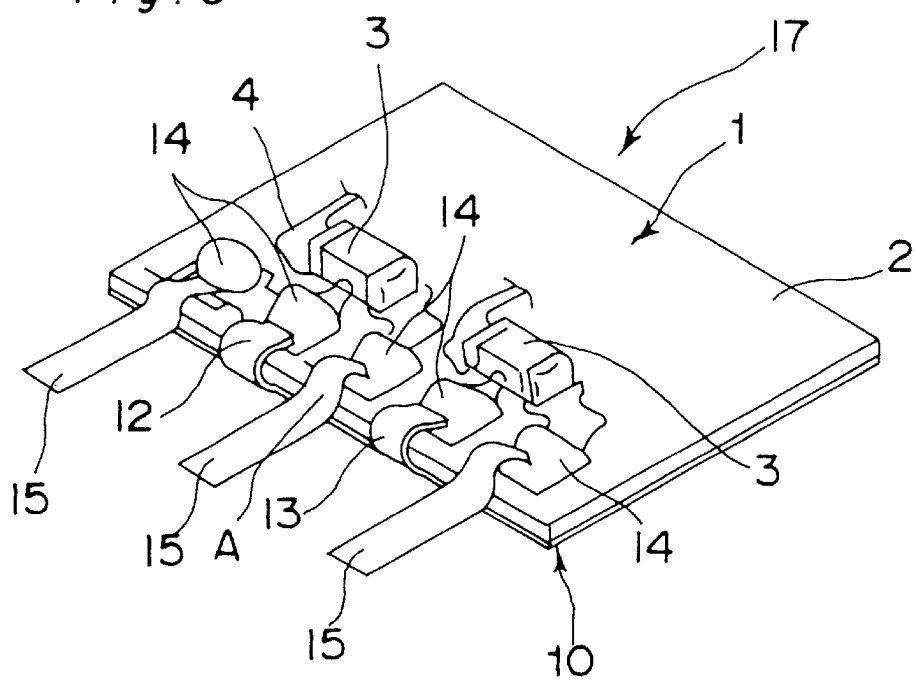
FIG. 3 is a perspective view illustrating a hybrid integrated circuit of Embodiment 1 according to the present invention.

FIG. 3 is a perspective view illustrating a hybrid integrated circuit of Embodiment 1 of the present invention. In FIGS. 1, 2, and 3 like reference numerals indicate identical or functionally similar elements.

In FIG. 3 the clip means 12 and 13 are soldered to the electrodes 6 and 7 respectively. Lead terminals 15 are also soldered to the electrodes 5 and 8. The soldered points are indicated by a reference numeral 14. The electrodes 6 and 7 are connected to each other through the metal conductor member 10. The hybrid integrated circuit 17 thus formed is mounted on a frame by joining the plate portion 11 of the metal conductor member 10 to the frame with an insulate adhesive.

The lead terminal 15 from the electrode 5 is connected to the ground. Thus the hybrid integrated circuit of Embodiment 1 of the present invention has a reduced impedance ground wiring due to the metal conductor member 10. Noise suppressing components such as three-terminal capacitors work effectively in the hybrid integrated circuit and hence make the hybrid integrated circuit immune to noise.

Embodiment 2

In Embodiment I separate lead terminals 15 are used to connect to the electrodes 5 and 8. A hybrid integrated circuit of Embodiment 2, however, includes clip means of the metal conductor member, corresponding to all the electrodes on the circuit substrate. Further, each clip means has a lead terminal on the end of the clip means.

Figure 4:
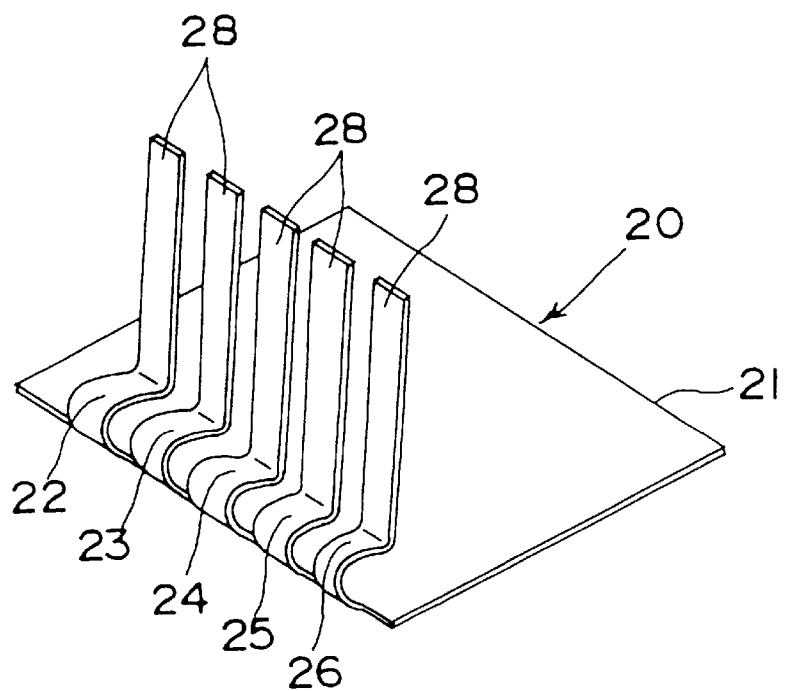
FIG. 4 is a perspective view of a metal conductor member of the hybrid integrated circuit of Embodiment 2 according to the present invention.

FIG. 4 is a perspective view showing a metal conductor member 20 of the hybrid integrated circuit of Embodiment 2 of the present invention. The metal conductor member 20 differs from the metal conductor member 10 shown in FIG. 1 in that the metal conductor member 20 has a clip means corresponding to each of the electrodes 4–8 on the circuit substrate 1 and that each clip means has a lead terminal at its end.

In FIG. 4 the metal conductor member 20 is an almost square metal plate 21 which includes almost "L" shaped clip means 22, 23, 24, 25, and 26, formed along a side thereof, for holding the circuit substrate 1.

The clip means 22 is formed at a corresponding place to the electrode 5 on the circuit substrate 1. Likewise the clip means 23, 24, 25, and 26 are formed at corresponding places to the electrodes 6, 8, 7, and the other 8 on the circuit substrate 1 as shown in FIG. 1. A lead terminal 28 projects from the end of each clip means in the direction approximately perpendicular to the plate portion 21. The metal conductor member 20 is formed in one piece: a metal plate is stamped in a desired shape which is then undergoes a bending process to form the plate portion 21, the clip means 22–26, and the lead terminal portions 28.

Next, we describe the processes to combine the metal conductor member 20 shown in FIG. 4 with the circuit substrate 1 shown in FIG. 1 to form a hybrid integrated circuit. First, the circuit substrate 1 is inserted into the clip means 22–26 so that the clip means 22 connects to the electrode 5 of the circuit substrate 1; the clip means 23, to the electrode 6 of the circuit substrate 1; the clip means 24, to one of the electrodes 8 of the circuit substrate 1; the clip means 25, to the electrode 7 of the circuit substrate 1; and the clip means 26, to the other electrodes 8 of the circuit substrate 1. The plate portion 21 of the metal conductor member 20 is joined to the non-mounting surface of the insulation substrate 2 with an insulate adhesive (not shown).

Next, the clip means 22, 23, 24, 25, and 26 are soldered to the corresponding electrodes. The soldered points are indicated by reference numeral 14. Then, the clip means 23 and 25 are cut off at their roots on the plate portion 21. This completes the processes and the hybrid integrated circuit thus formed is mounted on a frame by joining the plate portion 21 of the metal conductor member 20 to the frame with an insulation adhesive. It is noted that all the processes except the above are the same as in Embodiment 1.

The hybrid integrated circuit of Embodiment 2 of the present invention gives the same effect as that of Embodiment 1. Further, in this embodiment, the separate lead terminals of the hybrid integrated circuit of Embodiment 1 are formed as part of the metal conductor member 20. Therefore, in the present embodiment, separate lead terminals are not necessary, and all the lead terminals can be soldered with the electrodes at the same time. Embodiment 2 facilitates the manufacturing process for hybrid integrated circuits, improves the production efficiency, and reduces the production cost.

Embodiment 3

In Embodiments 1 and 2, the non-mounting surface of the insulation substrate is joined to the metal conductor member with an adhesive to build a complete hybrid integrated circuit, which, in turn, is joined to a frame by pasting the other side of the metal conductor member to the frame. The hybrid integrated circuit of Embodiment 3 uses a metal conductor member with a through hole in the plate portion. With this structure the adhesion of the non-mounting insulation substrate to the metal conductor member can be done at the same time as the hybrid integrated circuit is pasted to a frame.

Figure 5:
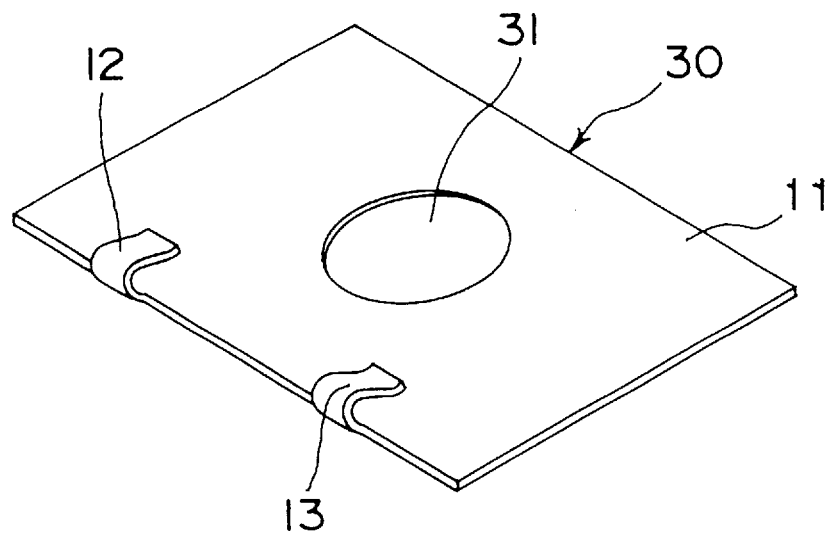
FIG. 5 is a perspective view of a metal conductor member of the hybrid integrated circuit of Embodiment 3 according to the present invention.

FIG. 5 is a perspective view of the metal conductor member of the hybrid integrated circuit of Embodiment 3. The elements in FIG. 5 identical to those in FIG. 1 are indicated with the same reference numerals and no further description is given. The metal conductor member 30 in FIG. 5 differs from the metal conductor member 10 shown in FIG. 1 in that the metal conductor member 30 has a through hole near the center of the plate portion. The metal conductor member 30 is formed in one piece by stamping a metal plate as the metal conductor member 10 is formed. The through hole 31 and the plate portion 11 are both formed during this stamping process. The clip means 12 and 13 are bent after the stamping process. Although the metal conductor member 30 of Embodiment 3 as shown in FIG. 5 includes only one through hole, it can have a plurality of through holes.

Figure 6:
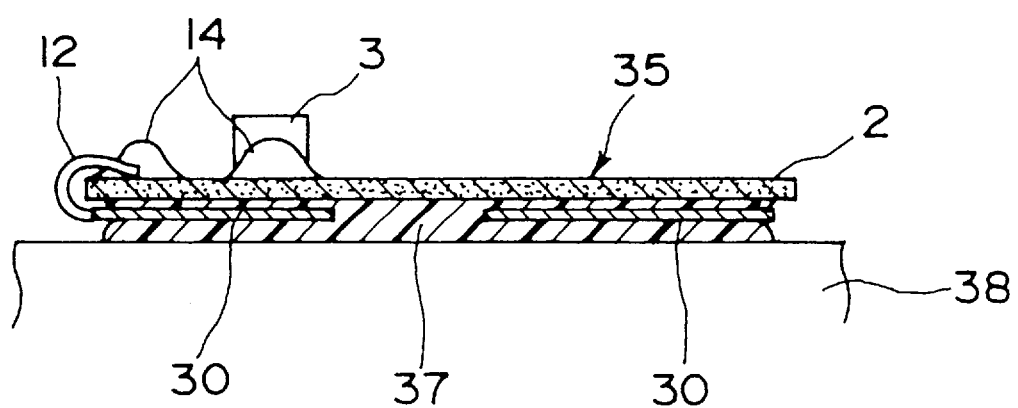
FIG. 6 is a partial cross section of the hybrid integrated circuit of Embodiment 3 according to the present invention that is joined to a frame with an adhesive.

FIG. 6 is a partial cross section of the hybrid integrated circuit of Embodiment 3 of the present invention that is pasted to a frame. The elements in FIG. 6 identical to those in FIGS. 1–3 are indicated with the same reference numerals and no further description is given.

Referring to FIG. 6, the circuit substrate 1 is inserted into the metal conductor member 30 shown in FIG. 5 as in the case of Embodiment 1. However, in this case, at this moment, the non-mounting surface of the insulation substrate 2 is not pasted to the plate portion 11 of the metal conductor member 30.

Now, the clip means 12 and 13 are soldered to the electrodes 6 and 7 respectively. Lead terminals 15 are also soldered to the electrodes 5 and 8. The soldered points are indicated by a reference numeral 14. Then, the hybrid integrated circuit 35 thus formed is joined to a frame 38 by pasting the plate portion 11 of the metal conductor member 30 to the frame with an insulation adhesive 37. The adhesive 37 is also applied to the portion of the non-mounting side of the insulation substrate 2 exposed through the hole, and the adhesive penetrates into the space between the plate portion 11 of the metal conductor member 30 and the non-mounting side of the insulation substrate 2. Thus the non-mounting side of the insulation substrate 2 is joined to the plate portion 11 of the metal conductor member 30.

Next, another type of hybrid integrated circuit of Embodiment 3 of the present invention will be described below.

Figure 7:
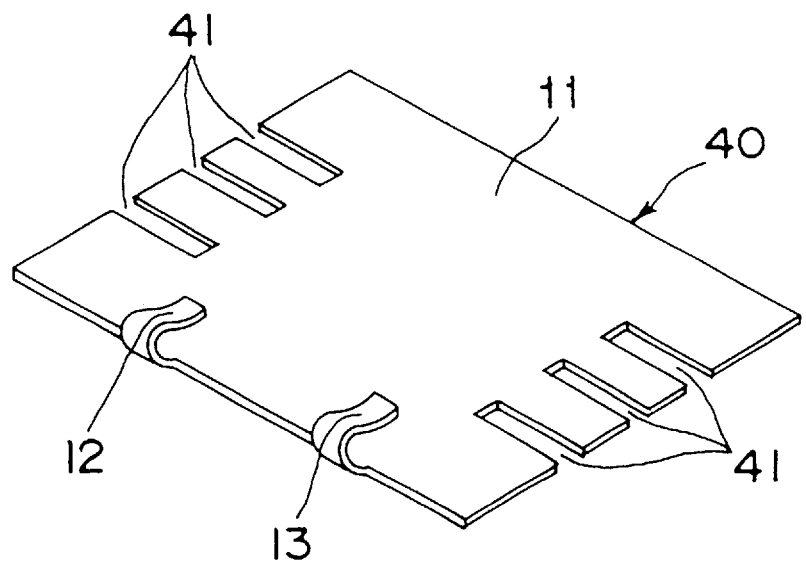
FIG. 7 is a perspective view of another type of metal conductor member of a hybrid integrated circuit of Embodiment 3.

FIG. 7 shows another type of metal conductor member 40 of a hybrid integrated circuit of Embodiment 3 of the present invention. The metal conductor member 40 differs from the metal conductor member 10 as shown in FIG. 1 in that the plate portion 11 of the metal conductor member 40 has two sides, next to the side with the clip means 12 and 13, each having a plurality of notches 41 as shown in FIG. 7. The metal conductor member 40 is formed in one piece by stamping a metal plate as the metal conductor member 10 is formed. The notches 41 and the plate portion 11 are formed in this stamping process. The clip means 12 and 13 are bent after the stamping process.

Then the hybrid integrated circuit 35 thus formed is joined to the frame 38 by adhering the plate portion 11 of the metal conductor member 40 to the frame 38 with an insulate adhesive 37. The adhesive 37 is also applied to that portion of the non-mounting side of the insulation substrate 2 exposed through the notches 41, and the adhesive penetrates into the space between the plate portion 11 of the metal conductor member 40 and the non-mounting side of the insulation substrate 2. Thus the non-mounting side of the insulation substrate 2 is pasted to the plate portion 11 of the metal conductor member 40. The notches 41 in the plate portion 11 can be formed along any one side, any two sides, any three sides, or even along all the four sides of the plate portion 11. The number of notches formed along any one side of the plate portion 11 is at least one.

The metal conductor member of the hybrid integrated circuit of Embodiment 3 may be implemented with a plate portion having various structures such as a mesh structure. The hybrid integrated circuit of the present embodiment is the same as that of Embodiment 1 except for the above differences and no further detailed description will be given.

The hybrid integrated circuit of Embodiment 3 of the present invention gives the same effect as that of Embodiment 1. Further, as described above, in this embodiment, the plate portion 11 of the metal conductor member has either a through hole 31 or notches 41. Therefore, when the hybrid integrated circuit is joined to the frame 38 with the adhesive 37, the adhesive is also applied to the portion of the non-mounting side of the insulation substrate 2 exposed through the through holes or the notches and the adhesive penetrates into the space between the plate portion 11 of the metal conductor member and the non-mounting side of the insulation substrate 2. Thus the non-mounting side of the insulation substrate 2 is pasted to the plate portion 11 of the metal conductor member at the same time as the hybrid integrated circuit is joined to the frame. Therefore, the manufacturing process is simplified and the manufacturing cost is reduced.

Embodiment 4

A metal conductor member of a hybrid integrated circuit of Embodiment 4 includes guides added to the metal conductor member of any of Embodiments 1, 2, and 3 so that the electrodes of the circuit substrate 1 are readily placed at their corresponding clip means of the metal conductor member.

Figure 8:
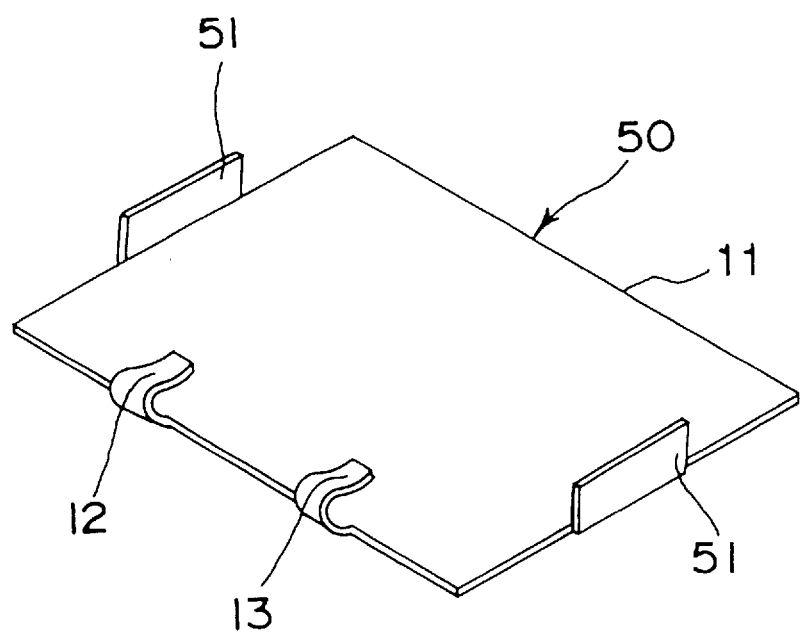
FIG. 8 is a perspective view of a metal conductor member of the hybrid integrated circuit of Embodiment 4 according to the present invention.
Figure 9:
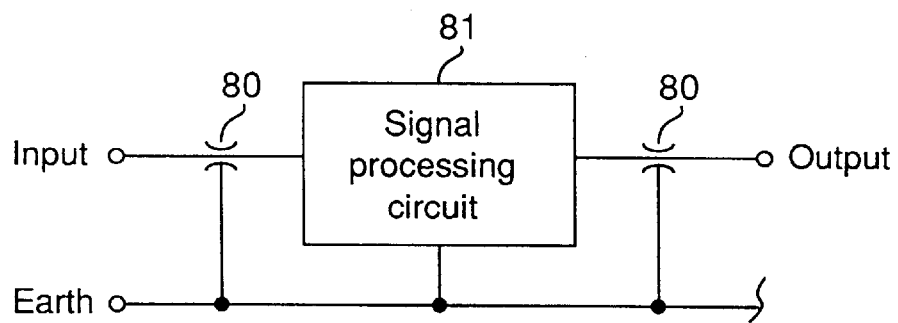
FIG. 9 is a schematic diagram of a circuit in which three-terminal capacitors are used.

FIG. 8 is a perspective view of a metal conductor member of a hybrid integrated circuit of Embodiment 4. The elements, in FIG. 8, identical to those in FIG. 1 are indicated with the same reference numerals and no further description is given. The metal conductor member 50, as shown in FIG. 8, differs from the metal conductor member 10 shown in FIG. 1 in that the plate portion 11 of the metal conductor member 50 has wall-like guides 51 on the sides adjacent to the side with the clip means 12 and 13. The guides are formed almost perpendicular to the plate portion 11.

When the circuit substrate 1 is inserted into the clip means 12 and 13 of the metal conductor member 50 along the guides 51, the electrodes 6 and 7 of the circuit substrate 1 match the clips 12 and 13 respectively and electrical connections are established. The metal conductor member 50 is formed in one piece: a metal plate is stamped in a desired shape which is then undergoes a bending process to form the plate portion 11, the clip means 12 and 13, and the guides 51. The hybrid integrated circuit of the present embodiment is the same as that of Embodiment 1 except for the above differences and no further detailed description will be given. Although in the above description one guard 51 is formed on each given side of the plate portion 11, a plurality of guides 51 instead may be formed there.

The hybrid integrated circuit of Embodiment 4 of the present invention gives the same effect as that of Embodiment 1. Further, as described above, the present embodiment includes guides 51 on the plate portion 11 of the metal conductor member 50 which facilitate the process of inserting the circuit substrate 1 into the clip means 12 and 13 and the process of matching the electrodes 6 and 7 with the clip means 12 and 13 respectively. This improves the production efficiency.

The metal conductor members of Embodiments 1–4 are used for reducing the impedance of the ground wiring. It should be noted, however, that those metal conductor members can also be applied to other wiring to reduce their impedances. It should also be noted that each of the clips 12 and 13 of the metal conductor member 10 of Embodiment 1 may have a lead terminal 28 as in Embodiment 2.

The hybrid integrated circuit of the present invention, as described above, comprises a metal conductor member with clip means for holding the circuit substrate inserted into the clip means. These clip means are formed at places corresponding to the selected electrodes of the circuit substrate so that the clip means and the selected electrodes make electrical contact when the circuit substrate is inserted into the clip means. Therefore, the impedance of a desired wiring of the circuit substrate can be reduced by using the metal conductor member. For example, if this scheme is applied to a ground wiring, the impedance of the ground wiring is reduced and hence noise suppressing components such as three-terminal capacitors will work more effectively making the hybrid integrated circuit immune to noise.

When lead terminals are formed on the ends of the clip means, separate lead terminals are not necessary. All the lead terminals can be soldered with the electrodes at the same time and they are used for connecting to external circuits including the ground. This improves the production efficiency.

A hybrid integrated circuit in one embodiment of the present invention has a metal conductor member including clip means, each corresponding to one of the electrodes of the circuit substrate formed in a single line along a side of the insulation substrate. Each of the clip means has a lead terminal at its end. All the clip means are soldered to the electrodes at the same time. The clip means which do not correspond to the selected electrodes, such as the electrodes for grounding, are cut off at the roots on the plate portion. This embodiment, therefore, does not require separate lead terminals, thus improving production efficiency and reducing production cost.

The insulation substrate of the circuit substrate is pasted to the plate portion of the metal conductor member on the side on which the clip means are formed. The other side of the plate portion of the metal conductor member is used to paste the hybrid integrated circuit to the frame. If the plate portion has at least one through hole or at least one notch, the non-mounting side of the insulation substrate is pasted to the plate portion of the metal conductor member at the same time as the hybrid integrated circuit is joined to the frame with the adhesive. Therefore, the manufacturing process is simplified and the manufacturing cost is reduced.

One embodiment of the present invention includes guides on the plate portion of the metal conductor member which facilitate the process of inserting the circuit substrate into the clip means and the process of matching the electrodes with the clip means. Thus this embodiment improves production efficiency.

The metal conductor member as described above is formed out of a metal plate in one piece. The clip means, the plate portion, and the guides do not have to be made separately and then joined together, which again improves production efficiency.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A hybrid integrated circuit comprising:

a circuit substrate including an insulation substrate with at least one electronic device mounted thereon and with a patterned wiring having plural electrodes formed along one side of said insulation substrate; and a metal conductor member including a plate portion with at least one L-shaped clip member, formed along a side thereof corresponding to said one side of said circuit substrate for holding said circuit substrate inserted into said clip means, said insulation substrate being adhered to said metal conductor member over substantially an entire surface area of the plate portion by an insulate adhesive, said at least one clip member being formed on said metal conductor member to correspond to at least one of said plural electrodes of said circuit substrate so that said at least one clip member and said at least one electrode make electrical contact when said circuit substrate is inserted into said clip member.

2. The hybrid integrated circuit of claim 1, wherein each of said at least one clip member has a lead terminal at one end thereof.

3. The hybrid integrated circuit of claim 1, wherein said at least one electrode is for grounding.

4. The hybrid integrated circuit of claim 1, wherein said plate portion of said metal conductor member has at least one through hole therein.

5. The hybrid integrated circuit of claim 1, wherein said plate portion of said metal conductor member has at least one notch therein.

6. The hybrid integrated circuit of claim 1, wherein said plate portion of said metal conductor member includes guides which allow said at least one clip member to readily match said corresponding electrodes when said circuit substrate is inserted into said at least one clip member.

7. A hybrid integrated circuit comprising:

a circuit substrate including an insulation substrate with at least one electronic device mounted thereon and with a patterned wiring having electrodes all formed in a single line along one side of said insulation substrate, said electrodes being connected to respective lead terminals; and a metal conductor member including a plate portion with plural L-shaped clip members, formed along a side thereof corresponding to said one side of said circuit substrate, for holding said circuit substrate inserted into said clip members, said insulation substrate being adhered to said metal conductor member over substantially an entire surface area of the plate portion by an insulate adhesive, said clip members being formed at places corresponding to electrodes selected from said electrodes formed along one side of said insulation substrate so that said each of said clip members and each of said selected electrodes make electrical contact when said circuit substrate is inserted into said clip means.

8. The hybrid integrated circuit of claim 7, wherein said clip members of said metal conductor member are formed at places corresponding to all the electrodes of said circuit substrate and each of said clip members has a lead terminal at one end thereof.

9. The hybrid integrated circuit of claim 7, wherein the clip members that do not correspond to the selected electrodes are cut off at the root portions on the plate portion after said clip members and said corresponding electrodes make electrical contact.

10. The hybrid integrated circuit of claim 7, wherein said selected electrodes are for grounding.

11. The hybrid integrated circuit of claim 7, wherein said plate portion of said metal conductor member has at least one through hole therein.

12. The hybrid integrated circuit of claim 7, wherein said plate portion of said metal conductor member has at least one notch therein.

13. The hybrid integrated circuit of claim 7, wherein said plate portion of said metal conductor member includes guides which allow said clip members to readily match said corresponding electrodes when said circuit substrate is inserted into said clip means.

14. A hybrid integrated circuit comprising:

an insulation substrate having outer edges defining a mounting surface for mounting at least one electronic device thereon, and a non-mounting surface facing directly opposite the mounting surface; and a metal conductor member including,
a plate portion, having outer edges substantially corresponding in dimension to the outer edges defining the non-mounting surface of said insulation substrate; and
an insulate adhesive contacting the non-mounting surface of said insulation substrate, said insulation substrate adhered to said metal conductor member over substantially an entire surface area of the plate portion of said metal conductor member.

* * * * *